United States Patent
Okita et al.

(10) Patent No.: US 9,837,041 B2
(45) Date of Patent: Dec. 5, 2017

(54) DISPLAY UNIT

(71) Applicant: FANUC Corporation, Minamitsuru-gun, Yamanashi (JP)

(72) Inventors: Hiroshi Okita, Minamitsuru-gun (JP); Tohru Nishi, Minamitsuru-gun (JP)

(73) Assignee: FANUC CORPORATION, Minamitsuru-gun, Yamanashi (JP)

( * ) Notice: Subject to any disclaimer, the term of this patent is extended or adjusted under 35 U.S.C. 154(b) by 0 days.

(21) Appl. No.: 15/078,268

(22) Filed: Mar. 23, 2016

(65) Prior Publication Data
US 2016/0284310 A1    Sep. 29, 2016

(30) Foreign Application Priority Data

Mar. 27, 2015    (JP) .................................. 2015-065881

(51) Int. Cl.
*G09G 5/00*    (2006.01)
*G09G 5/36*    (2006.01)
(Continued)

(52) U.S. Cl.
CPC ............... *G09G 5/005* (2013.01); *G06F 1/16* (2013.01); *G09G 5/006* (2013.01); *G09G 5/363* (2013.01);
(Continued)

(58) Field of Classification Search
CPC ........ G09G 5/005; G09G 5/006; G09G 5/363; G09G 3/2096; G06F 1/16; G06F 1/1626;
(Continued)

(56) References Cited

U.S. PATENT DOCUMENTS

2008/0256350 A1    10/2008   Hattori et al.
2009/0122033 A1*   5/2009    Park ...................... G06F 1/3203
                                                       345/204
(Continued)

FOREIGN PATENT DOCUMENTS

JP    2001-237573 A    8/2001
JP    2004-133350 A    4/2004
(Continued)

OTHER PUBLICATIONS

Notification of Reasons for Refusal dated Mar. 21, 2017 in Japanese Patent Application No. 2015-065881 (3 pages) with an English translation (3 pages).

*Primary Examiner* — Jennifer Mehmood
*Assistant Examiner* — Sardis F Azongha
(74) *Attorney, Agent, or Firm* — Drinker Biddle & Reath LLP

(57) ABSTRACT

Disclosed is a display unit provided with a display control printed circuit board with a circuit configured to generate a display signal for display by a display panel and a fixing metal plate for securing the display control printed circuit board. The display control printed circuit board is provided with identification information reading means for reading identification information of the display panel, a memory stored with set values for generating display signals corresponding to the sizes of a plurality of display panels, and a display controller configured to generate the display signals. The fixing metal plate comprises one or more members electrically connected to the display control printed circuit board and configured to transmit the identification information of the display unit to the display control printed circuit board. The identification information reading means reads a set value for the display panel from the memory, based on the identification information of the display panel derived (Continued)

from the one or more electrically connected members, and sets the set values in the display controller configured to generate the display signals.

6 Claims, 5 Drawing Sheets

(51) Int. Cl.
*H05K 1/02* (2006.01)
*G06F 1/16* (2006.01)

(52) U.S. Cl.
CPC ............ *H05K 1/02* (2013.01); *G09G 2320/08* (2013.01); *G09G 2370/042* (2013.01); *H05K 2201/10227* (2013.01)

(58) Field of Classification Search
CPC ...... G06F 1/1637; H05K 1/0296; H05K 1/11; H05K 1/18; H05K 1/111–1/117; H05K 7/00; H05K 7/02; H05K 7/04; H05K 7/1422

See application file for complete search history.

(56) References Cited

U.S. PATENT DOCUMENTS

| | | | |
|---|---|---|---|
| 2011/0070923 A1 | 3/2011 | Tang et al. | |
| 2012/0105650 A1 | 5/2012 | Kitaya et al. | |
| 2013/0088525 A1* | 4/2013 | Qiu | G09G 5/006 345/690 |
| 2013/0169575 A1* | 7/2013 | Masuda | G06F 3/041 345/173 |

FOREIGN PATENT DOCUMENTS

| | | |
|---|---|---|
| JP | 2005-079666 A | 3/2005 |
| JP | 2008-032888 A | 2/2008 |
| JP | 2008-186261 A | 8/2008 |
| JP | 2011-034065 A | 2/2011 |
| JP | 2011-203399 A | 10/2011 |

\* cited by examiner

DISPLAY UNIT

RELATED APPLICATION DATA

This application claims priority under 35 U.S.C. §119 and/or §365 to Japanese Application No. 2015-065881 filed Mar. 27, 2015, the entire contents is incorporated herein by reference.

BACKGROUND OF THE INVENTION

Field of the Invention

The present invention relates to a display unit adapted to be mounted on various electronic apparatuses.

Description of the Related Art

As described in Japanese Patent Application Laid-Open No. 2011-203399, a display unit that combines a display panel and a control circuit for controlling the display panel is based on a well-known technique.

As shown in FIG. 1, a liquid-crystal display unit 1 comprises a display panel 10 for various liquid-crystal displays, a display control printed circuit board 2 for controlling a display signal to be transmitted to the display panel 10, and a fixing metal plate 8 for securing these elements. The illustration of a housing part of the display unit is omitted.

The display control printed circuit board 2 is mounted with a display controller 5 for generating a display control signal, a central processing unit (CPU) 3 for setting the display controller 5, and a memory 4 stored with set values for the display panel 10.

The display signal generated by the display control printed circuit board 2 is transmitted from a display signal connector 6 of the printed circuit board 2 to the display panel 10 by a display signal cable 7. The display panel 10 varies in resolution (number of pixels displayed on a screen), dot clock (clock as a reference for transfer per pixel), horizontal scanning frequency (updated number of lines capable of being displayed in each second), and vertical scanning frequency (number of screens updated in each second), depending on its size. For a correct display, therefore, it is necessary to identify the size of the display panel 10, generate the display signal conforming to the specifications of the display panel 10, and send it to the display panel 10. A correct display cannot be obtained if the display signal does not conform to the specifications of the display panel 10.

FIG. 2 shows a configuration and processing of the display control printed circuit board 2. The CPU 3 reads identification information (hereinafter referred to as "ID") of the display panel 10 (numeral 11), reads a set value corresponding to the ID from the memory 4 (numeral 12), and sets the resolution, dot clock, horizontal scanning frequency, vertical scanning frequency, and the like for the display controller 5 (numeral 13). The display controller 5 generates the display signal according to the set values and transmits it to the display panel 10 (numeral 14).

Since the display panel 10 does not have its own ID, the CPU 3 cannot read any ID of the display panel 10 from the display signal connector 6 of FIG. 1. Instead, a circuit for identifying the ID of the display panel 10 should be mounted on the display control printed circuit board 2 so that the CPU 3 can read the ID. In this case, however, types required for the display control printed circuit board 2 are as many as those for the display panel 10 to be combined therewith.

If a large number of types are provided for the display control printed circuit board 2, the manufacture requires production control based on the types for the liquid-crystal display unit 1 to be shipped. In assembling the liquid-crystal display unit 1, moreover, the printed circuit board 2 may possibly be assembled by mistake.

Further, at the time of maintenance of the liquid-crystal display unit 1, the display control printed circuit board 2 varies depending on the size of the display panel 10 of the liquid-crystal display unit 1, so that the number of maintenance parts increases. In some cases, furthermore, the printed circuit board 2 may be wrongly mounted at the time of replacement.

SUMMARY OF THE INVENTION

Accordingly, the object of the present invention is to provide a display unit in which a display control printed circuit board can be shared in common without regard to the size of a display panel.

A display unit according to the present invention is characterized in that a display control printed circuit board and a fixing metal plate are provided with a structure for acquiring an ID of a display panel. If the size of the display panel varies, the shape of the fixing metal plate on which the display panel is mounted varies. More specifically, the display panel and the fixing metal plate are directly related in size, so that the ID of the display panel is identified by identifying that of the fixing metal plate. Thus, the display control printed circuit board can be shared in common without regard to the size of the display panel. In some cases, even display panels of the same size may be differently set for a display controller due to differences in resolution or the like. However, means according to the present invention can be applied by maintaining the direct relationship with the metal plate.

Further, the display unit according to the present invention comprises a display control printed circuit board with a circuit configured to generate a display signal for display by a display panel and a fixing metal plate for securing the display control printed circuit board. The display control printed circuit board comprises identification information reading means for reading identification information of the display panel, a memory stored with set values for generating display signals corresponding to the sizes of a plurality of display panels, and a display controller configured to generate the display signals. The fixing metal plate comprises one or more members electrically connected to the display control printed circuit board and configured to transmit the identification information of the display unit to the display control printed circuit board. The identification information reading means reads a set value for the display panel from the memory, based on the identification information of the display panel derived from the one or more electrically connected members, and sets the set values in the display controller configured to generate the display signals.

According to the configuration of the present invention, there can be provided a display unit in which a display control printed circuit board can be shared in common without regard to the size of a display panel.

The fixing metal plate and the display control printed circuit board may be electrically connected to each other by a member or members for securing the display control printed circuit board to the fixing metal plate.

The fixing metal plate and the display control printed circuit board may be electrically connected to each other by a dedicated pin or pins.

The identification information of the display panel may be transmitted from the fixing metal plate to the display control printed circuit board by a combination of the one or more members.

BRIEF DESCRIPTION OF THE DRAWINGS

The above and other objects and features of the present invention will be obvious from the ensuing description of embodiments with reference to the accompanying drawings, in which.

DETAILED DESCRIPTION OF THE PREFERRED EMBODIMENTS

Figure 1:
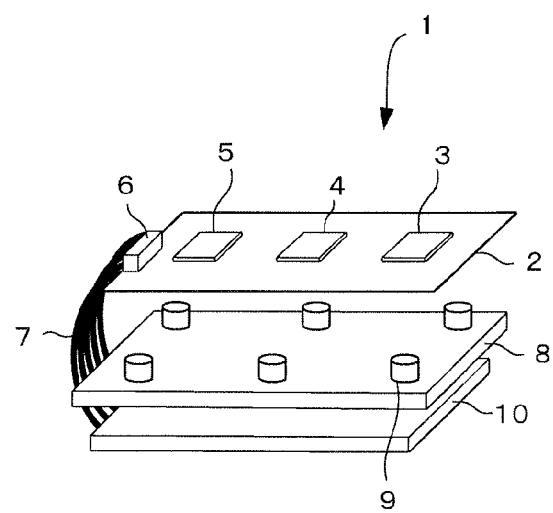
FIG. 1 is a view illustrating a conventional display unit.

Embodiments of the present invention will now be described with reference to the accompanying drawings. Like reference numerals are used to designate the same or similar configurations as those of the prior art.

Embodiment 1

Figure 3:
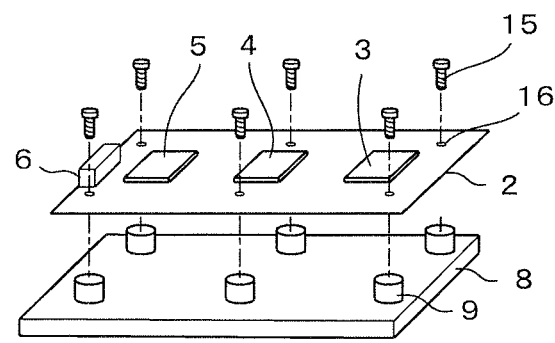
FIG. 3 is a view showing Embodiment 1 of the present invention.

FIG. 3 shows an embodiment of the present invention in which a fixing metal plate 8 is provided with studs 9 for securing a display control printed circuit board 2 such that the printed circuit board 2 can be secured to the studs 9 on the fixing metal plate 8 by screws 15. The printed circuit board 2 is mounted with a display controller 5 for generating a display control signal, a central processing unit (CPU) 3 for setting the display controller 5, and a memory 4 stored with set values for a display panel 10.

The display panel 10 (not shown in FIG. 3), like the one shown in FIG. 1, is mounted on the surface of the fixing metal plate 8 opposite to the display control printed circuit board 2. The printed circuit board 2 is provided with one or more threaded holes 16 through which the screws 15 are passed. The studs 9 on the fixing metal plate 8 are provided with threaded holes (not shown) to be fitted with the screws 15, individually.

On the display control printed circuit board 2 shown in FIG. 3, the CPU 3 reads identification information (hereinafter referred to as "ID") of the display panel 10, reads a set value corresponding to the ID from the memory 4, and sets the resolution, dot clock, horizontal scanning frequency, vertical scanning frequency, and the like for the display controller 5. The display controller 5 generates the display signal according to the set values and transmits it to the display panel 10.

Figure 2:
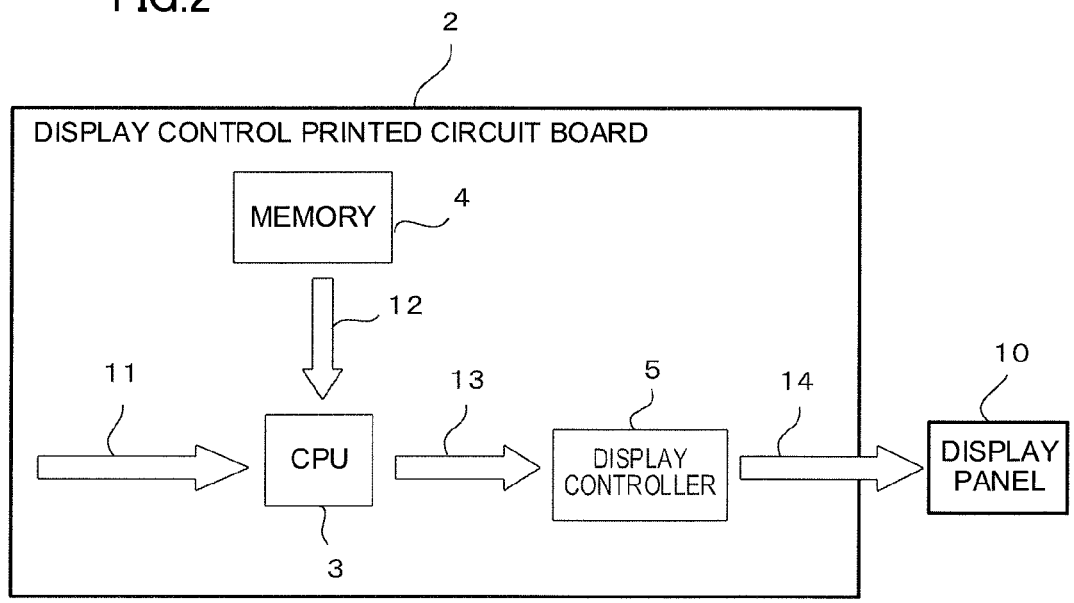
FIG. 2 is a block diagram of a display control printed circuit board.
Figure 4:
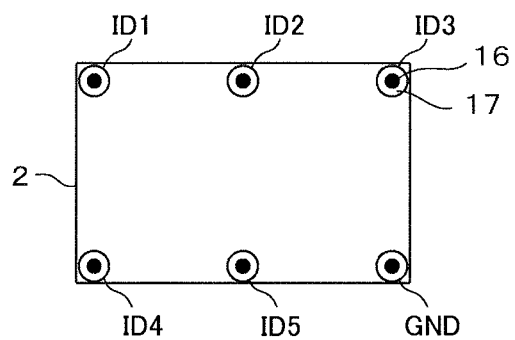
FIG. 4 is a view illustrating a configuration of a display control printed circuit board used in a display unit according to the present invention.

As shown in FIG. 4, ID pads ID5-ID1 are formed by providing pads 17 or other structures that electrically contact the studs on the fixing metal plate 8 around the threaded holes 16 in the surface of the display control printed circuit board 2 on the side of the fixing metal plate 8 (see FIG. 2). Further, one pad is electrically connected to GND for display control.

Figure 5:
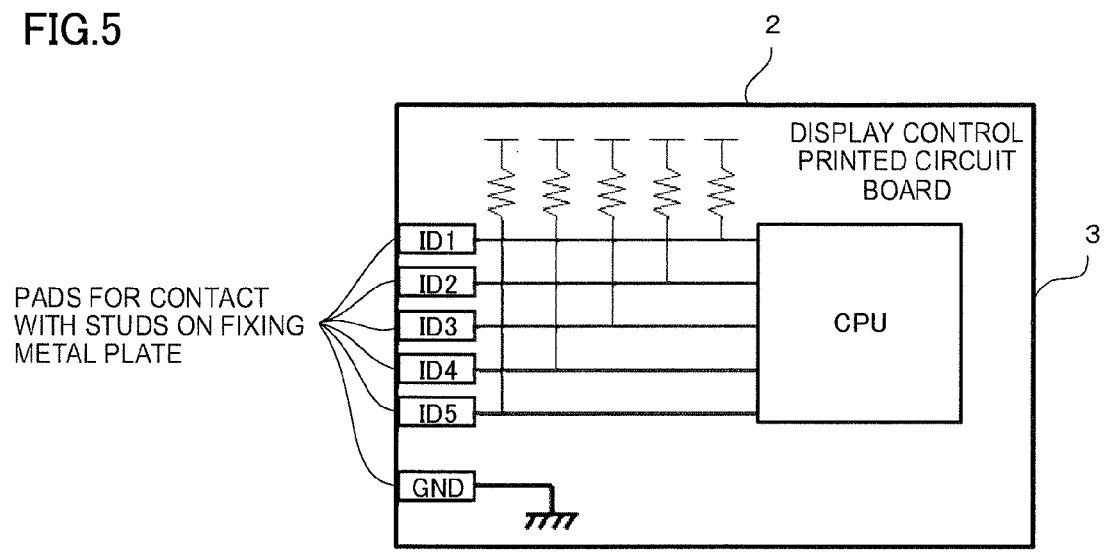
FIG. 5 is a block diagram of the display control printed circuit board shown in FIG. 4.

The ID pads ID5-ID1 are configured to read electrical information (1 or 0) from the CPU 3 on the display control printed circuit board 2, as shown in FIG. 5. The ID pads ID5-ID1 are previously pulled up in the printed circuit board 2 so that they can electrically read "1" if they are open without electrically contacting the fixing metal plate 8 and read "0" if GND is connected on the fixing metal plate 8.

On the side of the fixing metal plate 8, the studs 9 are made electrically conductive or non-conductive depending on the size of the display panel 10 so that the ID pads of the display control printed circuit board 2 indicative of the size of the display panel 10 are made to conduct to GND. The CPU 3 on the printed circuit board 2 can identify the size of the display panel 10 from the ID of the fixing metal plate 8 by reading signals from the ID pads.

Figure 6:
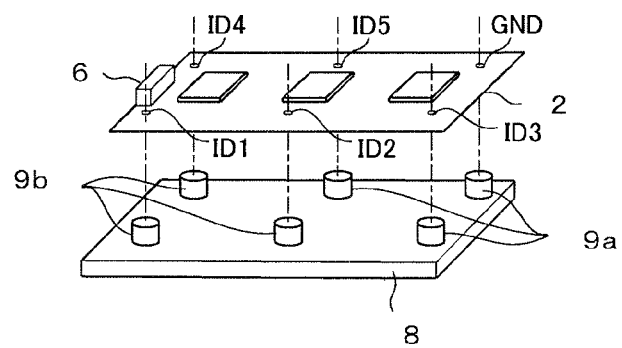
FIG. 6 is a view illustrating a more specific configuration of the display control printed circuit board used in the display unit according to the present invention.
Figure 7:
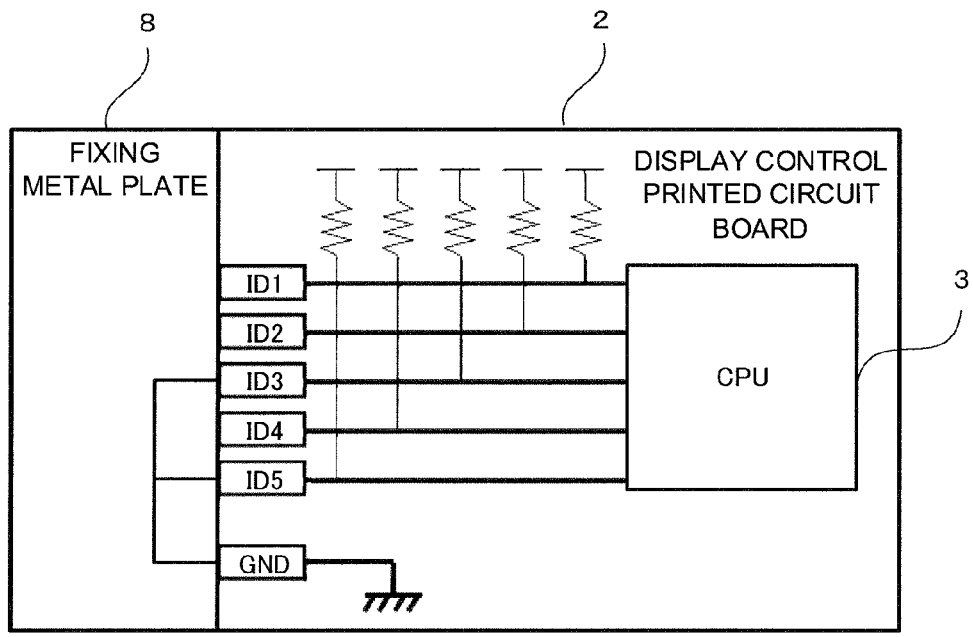
FIG. 7 is a block diagram of the display control printed circuit board shown in FIG. 6.

FIG. 6 is a view showing a specific example of the display control printed circuit board 2. The ID of the fixing metal plate for display size A, that is, the display panel 10, is assumed to be ID5-ID1=01011. In this case, as shown in FIG. 6, the studs that contact the pads ID3, ID5, and GND of the printed circuit board 2 become conductive studs. As shown in FIG. 7, in this case, the pads ID3 and ID5 are made to conduct to GND by the metal plate. Consequently, ID5-ID1 can be read as 01011. Based on this ID, the CPU 3 reads the set value of the display panel 10 stored in the memory 4, as shown in FIG. 2, and sets the display controller 5.

Embodiment 2

Figure 8:
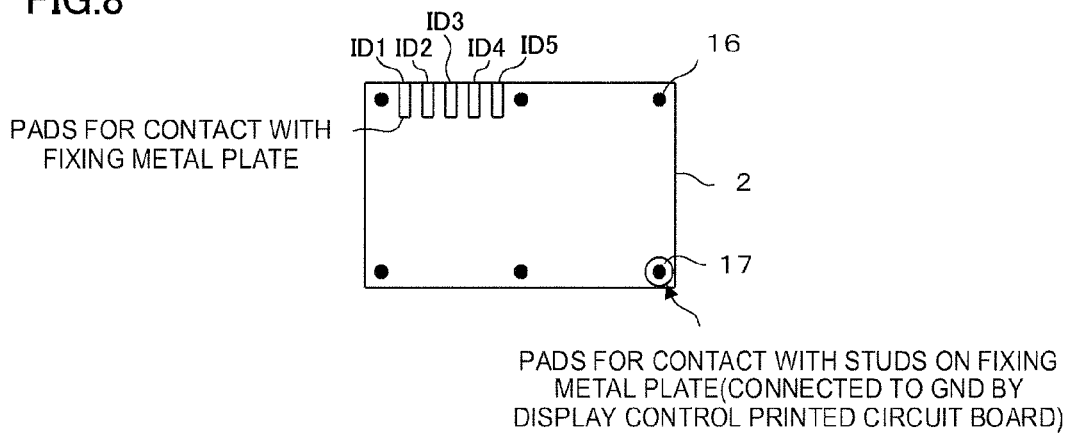
FIG. 8 is a view illustrating a configuration of another display control printed circuit board used in the display unit according to the present invention.

A circuit of a display control printed circuit board 2 of Embodiment 2 is the same as that of Embodiment 1 (see FIGS. 3 to 6). In Embodiment 2, however, the printed circuit board 2 and a fixing metal plate 8 are brought into electrical contact with each other by an alternative method. As shown in FIG. 8, the printed circuit board 2 is provided with pads ID5-ID1 for contact with pins to be brought into contact with the fixing metal plate 8.

The ID pads ID5-ID1 are configured to read electrical information (1 or 0) from a CPU 3 on the display control printed circuit board 2, as shown in FIG. 5. The ID pads ID5-ID1 are previously pulled up in the printed circuit board 2 so that they can electrically read "1" if they are open without electrically contacting the fixing metal plate 8 and read "0" if GND is connected on the fixing metal plate 8.

On the side of the fixing metal plate 8, electrical information on the ID pads of the display control printed circuit board 2 can be set to "0" by providing the electrically conductive pins 18 in the positions of the ID pads to be connected to GND, depending on the size of a display panel 10.

Figure 9:
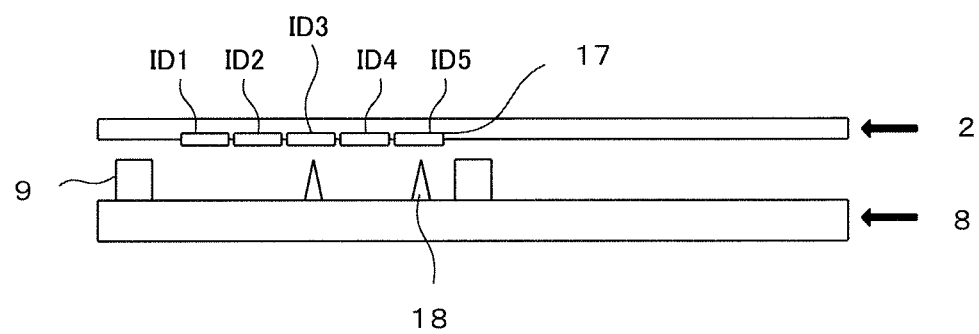
FIG. 9 is a view illustrating a configuration of still another display control printed circuit board used in the display unit according to the present invention.

Each conductive pin 18 may be a probe-like structure attached to the fixing metal plate 8 after its manufacture or means shaped by folding the material of the fixing metal plate 8. In the example of FIG. 9, the conductive pins 18 are provided on the same surface of the fixing metal plate 8 as studs 9 so as to correspond in position to ID pads ID3 and ID15, individually.

The ID pads ID3 and ID5 in the display control printed circuit board 2 are connected to GND by assembling the printed circuit board 2 to the fixing metal plate 8 by means of the studs 9. Consequently, the ID of this fixing metal plate, that is, the ID of the display panel, can be read as ID5-ID1=01011. Based on this ID, the CPU 3 reads the set value of the display panel 10 stored in a memory 4, as shown in FIG. 2, and sets a display controller 5.

Embodiment 3

A circuit for identifying the ID of the display panel 10 is mounted on a fixing metal plate 8. A CPU 3 may be made to read the ID through means for electrically connecting a display control printed circuit board 2 and the fixing metal plate 8.

While embodiments of the present invention have been described herein, the invention is not limited to the above-described embodiments and may be suitably modified and embodied in various forms.

The invention claimed is:

1. A display unit comprising a display control printed circuit board with a circuit configured to generate a display signal for display by a display panel and a fixing metal plate for securing the display control printed circuit board, wherein the display control printed circuit board comprises an identification information reading unit for reading identification information of the display panel, a memory stored with set values for generating display signals corresponding to sizes of a plurality of display panels, and a display controller configured to generate the display signals; the fixing metal plate comprises one or more members electrically connected to the display control printed circuit board and configured to transmit the identification information of the display unit to the display control printed circuit board; and the identification information reading unit reads set values for the display panel from the memory, based on the identification information of the display panel derived from the one or more electrically connected members, and sets the set values in the display controller configured to generate the display signals.

2. The display unit according to claim 1, wherein the fixing metal plate and the display control printed circuit board are electrically connected to each other by a member or members for securing the display control printed circuit board to the fixing metal plate.

3. The display unit according to claim 2, wherein the identification information of the display panel is transmitted from the fixing metal plate to the display control printed circuit board by a combination of the one or more members.

4. The display unit according to claim 1, wherein the fixing metal plate and the display control printed circuit board are electrically connected to each other by a dedicated pin or pins.

5. The display unit according to claim 4, wherein the identification information of the display panel is transmitted from the fixing metal plate to the display control printed circuit board by a combination of the one or more members.

6. The display unit according to claim 1, wherein the identification information of the display panel is transmitted from the fixing metal plate to the display control printed circuit board by a combination of the one or more members.

* * * * *